United States Patent [19]
Nakamura et al.

[11] Patent Number: 5,559,340
[45] Date of Patent: Sep. 24, 1996

[54] PHOTOCOUPLER CAPABLE OF EFFECTING PHASE CONTROL WITH AN EMBEDDED JUNCTION CAPACITOR

[75] Inventors: Hideyuki Nakamura, Nara; Atsushi Murayama, Nabari, both of Japan

[73] Assignee: Sharp Kabushiki Kaisha, Osaka, Japan

[21] Appl. No.: 426,869

[22] Filed: Apr. 24, 1995

[30] Foreign Application Priority Data

Apr. 25, 1994 [JP] Japan ................................ 6-086395

[51] Int. Cl.⁶ .................................................... G02B 27/00
[52] U.S. Cl. .................... 250/551; 250/214 R; 327/514
[58] Field of Search ................................ 250/551, 214 R; 327/514; 318/640

[56] References Cited

U.S. PATENT DOCUMENTS 3,932,770  1/1976  Fantozzi .................................. 327/514
4,259,939  4/1981  Coates .................................... 327/514
4,461,955  7/1984  Bezdek .................................... 250/551
4,833,346  5/1989  Marple .................................... 327/514
5,340,993  8/1994  Salina et al. ........................... 250/551

FOREIGN PATENT DOCUMENTS 5-54977  3/1993  Japan .

*Primary Examiner*—Stephone B. Allen

[57] ABSTRACT

A photocoupler includes: a first chip formed with a light emitting element emitting light in response to an input current; and a second chip formed with a light receiving element outputting a current having a magnitude in association with the intensity of the light from the light emitting element, a capacitor formed of a PN-junction for storing charges from the output current from the light receiving element, and a Darlington circuit having the capacitor interposed between the base and emitter thereof, The first and second chips are sealed to form a single photocoupler which is capable of solely effecting phase control.

13 Claims, 8 Drawing Sheets

T1 POSITIVE(+) OUTPUT

T2 NEGATIVE(−) OUTPUT

PHOTOCOUPLER CAPABLE OF EFFECTING PHASE CONTROL WITH AN EMBEDDED JUNCTION CAPACITOR

BACKGROUND OF THE INVENTION (1) Field of the Invention

The present invention relates to a device element for effecting phase control and in particular to a photocoupler capable of performing phase control with a single device element.

(2) Description of the Prior Art

First of all, a configurational example of a phase controlling circuit using a conventional photocoupler will be described with reference to drawings.

Figure 1:
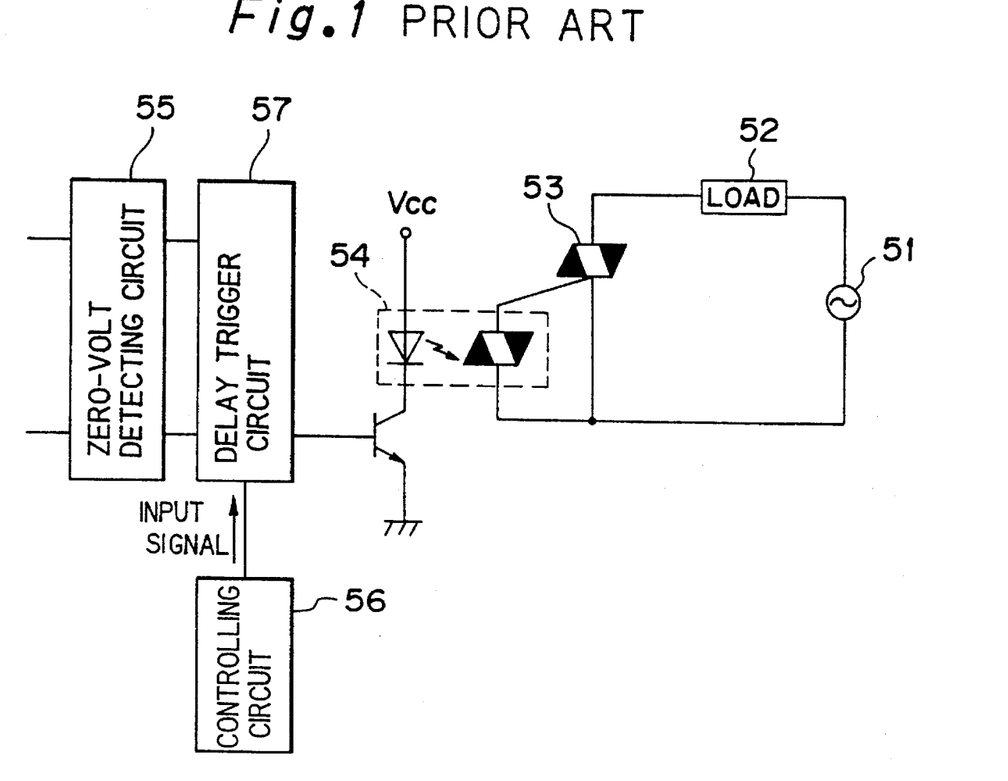
FIG. 1 is a view showing a typical circuit configuration of a phase controlling device equipped with a conventional photocoupler.

1) FIG. 1 shows a phase controlling circuit which is composed of an a.c. power supply 51, a load 52 and a bidirectional tri-terminal switch 53, all connected in series and the bidirectional tri-terminal switch 53 is varied in its turn-on timing to thereby perform phase control. This bidirectional tri-terminal switch 53 is supplied with an output from a photocoupler 54 as a trigger signal. The photocoupler 54 outputs the trigger signal when a pulse is launched by a zero-volt detecting circuit 55, a controlling circuit 56 and a delay trigger circuit 57. This pulse signal is outputted from the delay trigger circuit 57, at a time delayed with a delay instructed by the controlling circuit 56 from a referenced zero-volt timing detected by the zero-volt detecting circuit 55. In other words, the turn-on timing of the bidirectional tri-terminal switch 53 is delayed by the time specified by the controlling circuit 56, whereby phase can be controlled.

Figure 2:
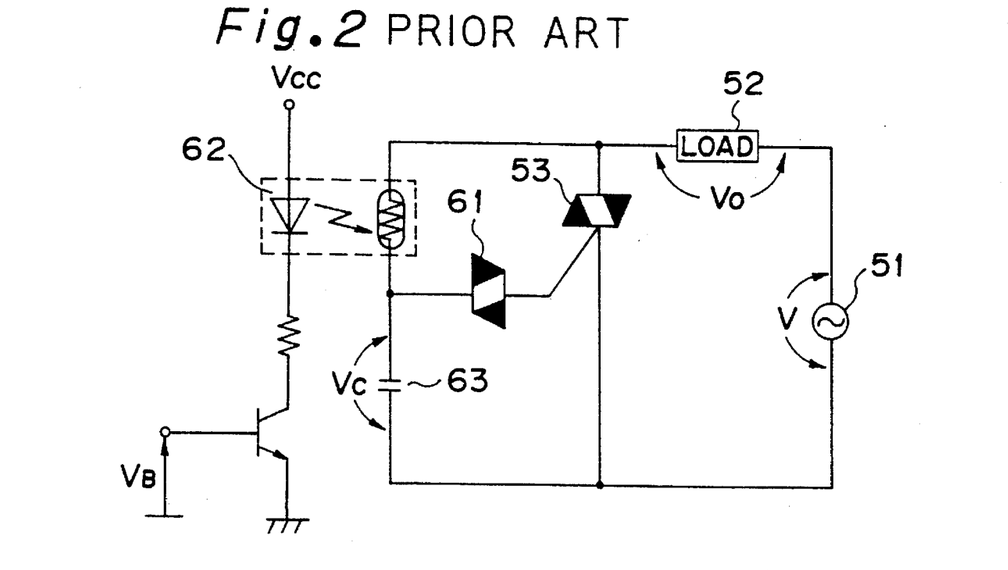
FIG. 2 is a view showing another typical circuit configuration of a phase controlling device equipped with a conventional photocoupler.
Figure 3:
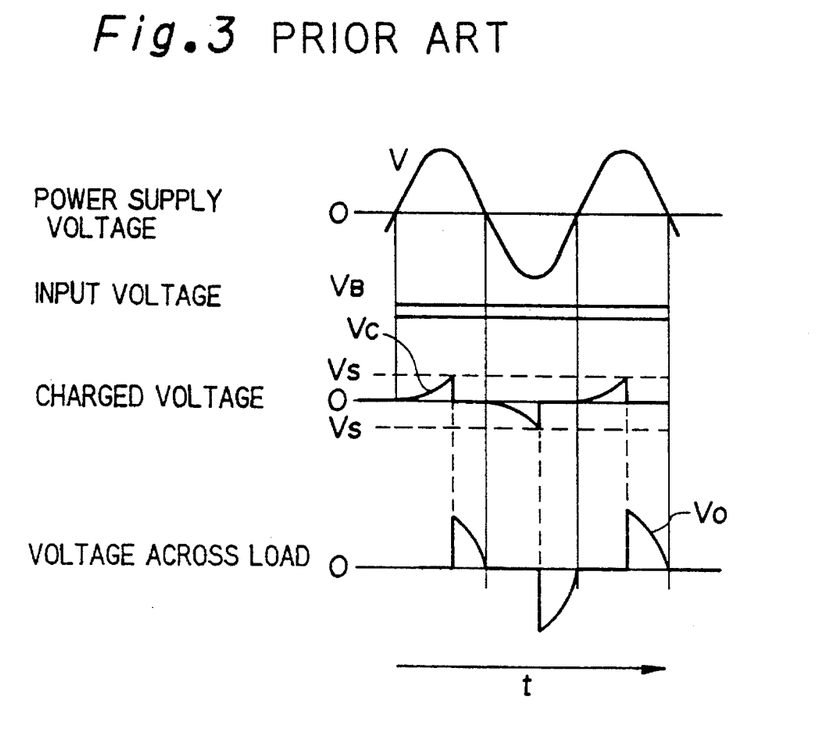
FIG. 3 is a chart showing voltage waveforms at key points in the phase controlling device shown in FIG. 2.

2) FIG. 2 shows another configurational example of a phase control circuit using another photocoupler and FIG. 3 shows voltage waveforms at several key points in the same circuit. In FIG. 2, like numerals are allotted to identical elements with those shown in FIG. 1, and repeated description is omitted. This circuit uses a photocoupler 62 having a CDS on a light-receiving side thereof which is varied in its internal resistance by light, and a capacitor 63 connected to the CDS. An output current from the light-receiving side of the photocoupler 62 charges the capacitor 63 whereby a charged voltage $V_C$ increases, causing a trigger signal to output for turning on a bidirectional tri-terminal switch 53. A diac etc., is used as an output device element (trigger element) 61 for outputting the trigger signal. As shown in FIG. 3, when a current corresponding to an input voltage $V_B$ is made to flow through the photocoupler 62, the charged voltage $V_C$ increases as shown in the figure. When this charged voltage $V_C$ exceeds a turn-on voltage $V_S$ for the trigger element 61, the trigger signal is outputted to activate the bidirectional tri-terminal switch 53, whereby a voltage $V_0$ is applied across the load 52. In this circuit, the duration until the trigger element 61 is turned on or the time taken for the charged voltage $V_C$ to reach the turn-on voltage $V_S$, varies depending on the magnitude of the current flowing through the CDS of the photocoupler 62, which in turn depends upon the input voltage $V_B$. This means that, in this configuration, phase control can be effected by varying the input voltage $V_B$.

One of the examples of the thus configurated phase control circuit is disclosed in Japanese Patent Application Laid-open Hei 5 No.54,977, and therefore publicly known.

The configurations 1) and 2) using a conventional photocoupler has respective drawbacks as follows: The configuration 1) needs three kinds of controlling circuitries 55, 56 and 57 to generate pulses for phase control. That is, as the pulse-generating timing must be set up by these circuitries, this complicates the circuit configuration and increases the number of parts.

The configuration 2) needs a number of parts such as a photocoupler, a trigger device, a capacitor, a bidirectional tri-terminal switch etc., increasing the number of parts, to thereby make the device bulky.

SUMMARY OF THE INVENTION

In view of the above problems, it is therefore an object of the present invention to provide a photocoupler composed of a less number of parts and capable of effecting phase control.

In accordance with a first aspect of the present invention, a photocoupler capable of effecting phase control, includes: a first chip formed with a light emitting element emitting light in response to an input current; and a second chip formed with a light receiving element outputting a current having a magnitude in association with the intensity of the light from the light emitting element, a capacitor formed of a PN-junction for storing charges from the output current from the light receiving element, and a Darlington circuit having the capacitor interposed between the base and emitter thereof, and is constructed such that the first and second chips are formed in a sealing structure.

In accordance with a second aspect of the present invention, a photocoupler capable of effecting phase control, includes: a first chip formed with a light emitting element emitting light in response to an input current; and a second chip formed with a light receiving element outputting a current having a magnitude in association with the intensity of the light from the light emitting element, a capacitor formed of a PN-junction for storing charges from the output current from the light receiving element, and a Darlington circuit having the capacitor interposed between the base and emitter thereof, and is constructed such that the first and second chips are formed in a sealing structure and a trigger element such as a Zener diode and the like is interposed in series between the base-emitter circuit in the Darlington circuit.

In accordance with a third aspect of the present invention, a photocoupler capable of effecting phase control, includes: a first chip formed with a light emitting element emitting light in response to an input current; and a second chip formed with a light receiving element outputting a current having a magnitude in association with the intensity of the light from the light emitting element, a capacitor formed of a PN-junction for storing charges from the output current from the light receiving element, and a Darlington circuit having the capacitor interposed between the base and emitter thereof, and is constructed such that the first and second chips are formed in a sealing structure and the second chip is further formed with a thyristor connected to the output gate of the Darlington circuit.

In accordance with a fourth aspect of the present invention, a photocoupler capable of effecting phase control, includes: a first chip formed with a light emitting element emitting light in response to an input current; and a second chip formed with a light receiving element outputting a current having a magnitude in association with the intensity of the light from the light emitting element, a capacitor formed of a PN-junction for storing charges from the output current from the light receiving element, and a Darlington circuit having the capacitor interposed between the base and emitter thereof, and is constructed such that the first and second chips are formed in a sealing structure, a trigger element such as a Zener diode and the like is interposed in series between the base-emitter circuit in the Darlington circuit, and the second chip is further formed with a thyristor connected to the output gate of the Darlington circuit.

In the present invention thus configurated, a first chip formed with a light emitting element and a second chip formed with a light receiving element, a capacitor and a Darlington circuit are sealed in a single photocoupling element. The first chip varies in its luminous intensity in response to an input current. In the second chip, a current $I_L$ varies in association with the light amount received from the light emitting element and this current charges the PN-junction capacitor. When the charged voltage reaches a predetermined level, the Darlington circuit is activated. The current $I_L$ here may be extremely small just enough to turn on the Darlington circuit. In the conventional phase controlling circuit, in order to activate the bidirectional tri-terminal switch or the like disposed downstream or the next step of a trigger element, a capacitor having a capacitance of about 0.1 µF would be needed to secure a voltage to turn on the switch. It is impossible to obtain such a capacitance by a junction capacitor (typically having some tens pF) formed inside a semiconductor chip. In the present invention, however, since the base current, before amplified by the Darlington transistor, is used to charge a capacitance, a small, junction capacitance is adequate to satisfy the need.

Based on the charged voltage across the capacitor, an input current is amplified by the Darlington circuit into a current having a large magnitude. Accordingly, when the photocoupler of the invention is applied to a phase controlling circuit, it is possible for the output current from the Darlington circuit to properly operate the phase controlling element such as a triac etc.

According to the present invention, when a trigger element is interposed in series into the base-emitter circuit of the Darlington circuit, the turn-on voltage of the Darlington circuit can be raised, so that it becomes possible to effect stabilized control. In this case, by properly setting up the trigger element interposed, it is possible to effect, on the basis of the turn-on voltage value raised, high-accuracy phase control in a broadened range.

In the present invention, the second chip may further include a triac. This triac is turned on by the output current from the Darlington circuit. Therefore, when the photocoupler thus equipped with the triac on the second chip is connected in series with the circuit having a load, it is possible to effect phase control of the load by only adjusting the input current to the photocoupler.

DESCRIPTION OF THE PREFERRED EMBODIMENTS

Embodiments of the present invention will hereinafter be described with reference to the accompanying drawings.

Figure 14:
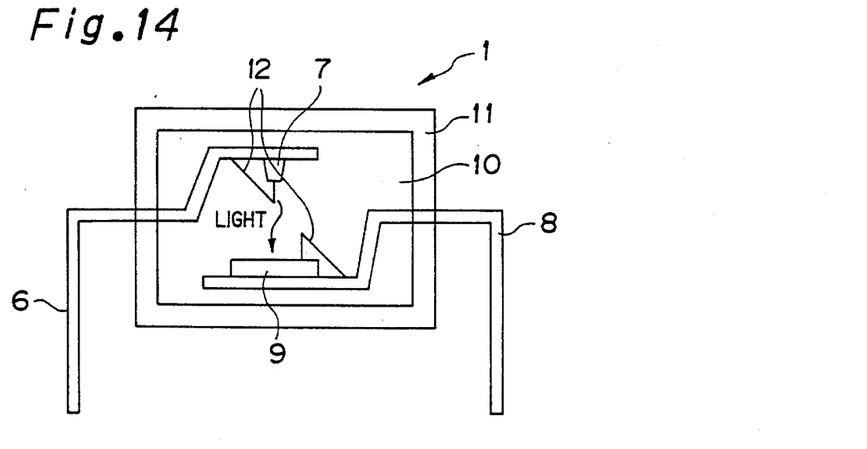
FIG. 14 is an illustration showing a configurational example of a photocoupler used in the present invention.

FIG. 14 is an illustration showing a configuration of a photocoupler used in an embodiment of the present invention. This photocoupler designated at 1 has a first chip 7 formed on a lead frame 6 and a second chip 9 formed on another lead frame 8. The two lead frames, arranged with the first chip 7 and the second chip 9 opposed to each other, are molded with a light-transmissive resin 10 and a light-shielding resin 11. Here, terminals of the first chip 7 and the second chip 9 are connected to respective lead frames 6 and 8 with leads 12.

Figure 4:
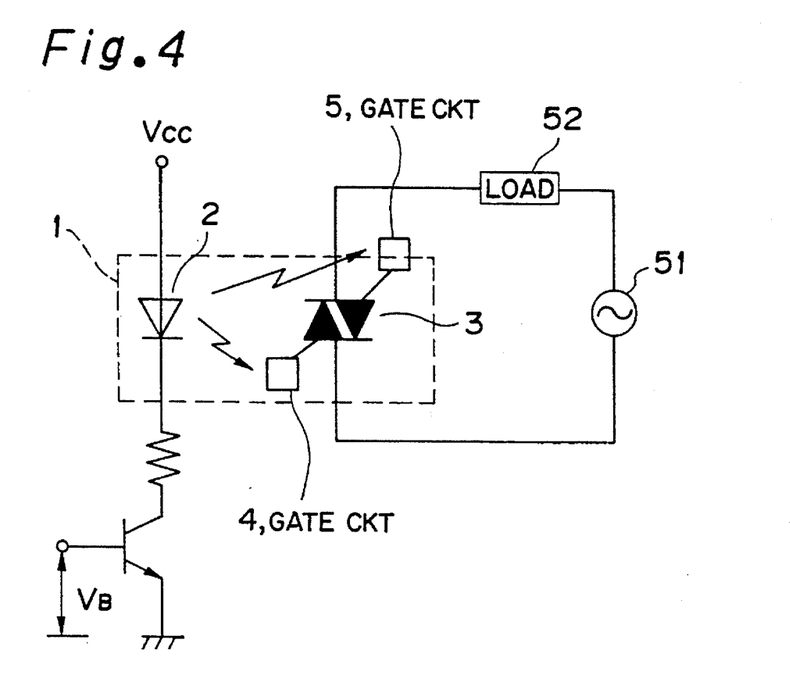
FIG. 4 is a view showing a circuit configuration example of a device equipped with a photocoupler in one embodiment of the present invention.

FIG. 4 is a circuit diagram showing a device including this photocoupler.

The photocoupler 1 in this embodiment comprises a light emitting element (light emitting diode) 2, a triac 3 and gate-current forming circuits 4 and 5. The light emitting element 2 is contained in the aforementioned first chip 7 while the gate-current forming circuits 4 and 5 as well as the triac (switching element) 3 are contained in the aforesaid second chip 9. An a.c. power supply 51 and a load 52 are connected in series with the triac 3. A current corresponding to an input voltage $V_B$ is adapted to flow through the light emitting element 2.

Each configuration of the above components will be described in detail.

Figure 6:
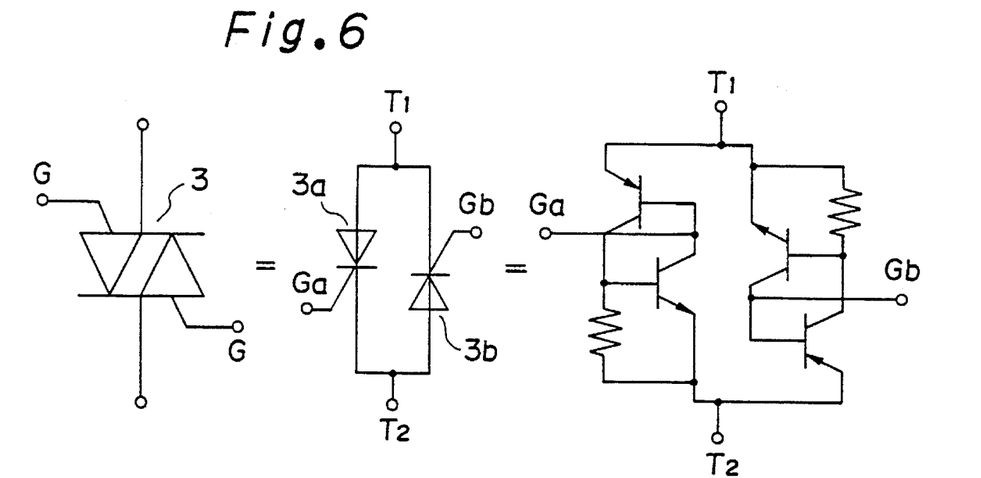
FIG. 6 is an equivalent circuit diagram of a triac portion of the photocoupler shown in FIG. 4.

FIG. 6 shows an equivalent circuit of the triac 3. The triac 3 in this embodiment is equivalent to a bidirectional thyristor and has thyristor portions 3a and 3b. The thyristor portion 3a is supplied with a gate current Ga while the thyristor portion 3b is inputted with a gate current Gb. Now, a terminal on both the anode side of the thyristor portion 3a and the cathode side of the thyristor portion 3b is designated at T1 while another terminal on both the cathode side of the thyristor portion 3a and the anode side of the thyristor portion 3b is designated at T2. With T1 and T2 connected to the positive and negative of an applied voltage, respectively, if a gate current Ga is inputted, the thyristor portion 3a will be activated. On the other hand, with T1 and T2 connected to the negative and positive of an applied voltage, respectively, if a gate current Gb is inputted, the thyristor portion 3b will be activated.

Figure 7:
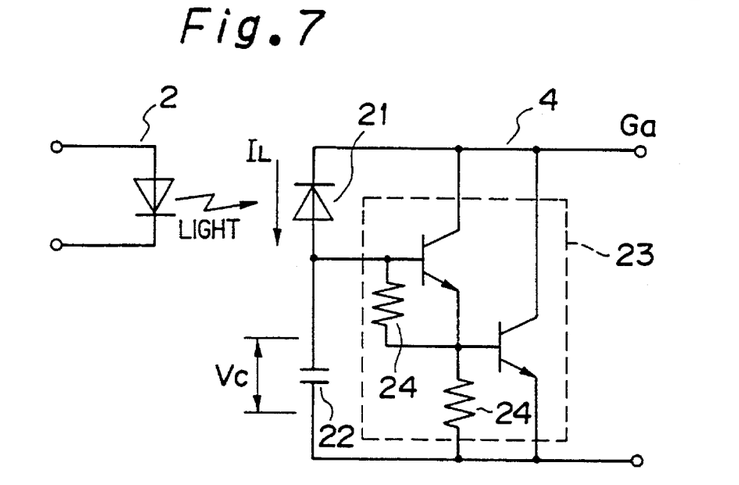
FIG. 7 is a diagram showing a configurational example of a gate-current forming circuit for the photocoupler shown in FIG. 4.

FIG. 7 shows a configuration of a gate-current forming circuit 4. The gate-current forming circuit 4 includes: a light receiving element (photodiode) 21 receiving light from the aforementioned light emitting element 2; a capacitor 22 formed with a PN-junction; and a Darlington circuit 23. A reference numeral 24 designates a resistance for adjusting transistor sensitivity. The capacitor 22 is connected in series with the light receiving element 21 and is charged by the output current from the light receiving element 21. The capacitor 22 is connected between the base and the emitter of the Darlington circuit 23. When the charged voltage $V_C$ across the capacitor 22 reaches a predetermined value $V_{BE}$, the Darlington circuit 23 is activated. Here, the period taken for the charged voltage $V_C$ to reach the predetermined value $V_{BE}$, is correlated with a current $I_L$ flowing through the light receiving element 21. Specifically, with the current $I_L$ through the light receiving element great, the time taken for sufficing $V_C \geq V_{BE}$ is short whereas the time taken for sufficing $V_C \geq V_{BE}$ is long when the current $I_L$ through the light receiving element is small. Therefore, the time taken for the Darlington circuit 23 to turn on can arbitrarily be set up by adjusting the current $I_L$ inputted to the light receiving element 21. When the Darlington circuit 23 is activated, the gate current Ga is outputted.

The gate-current forming circuit 5 has the similar structure to that of the gate-current forming circuit 4 except in that the current through the circuit 5 flows in the opposite direction.

Figure 5:
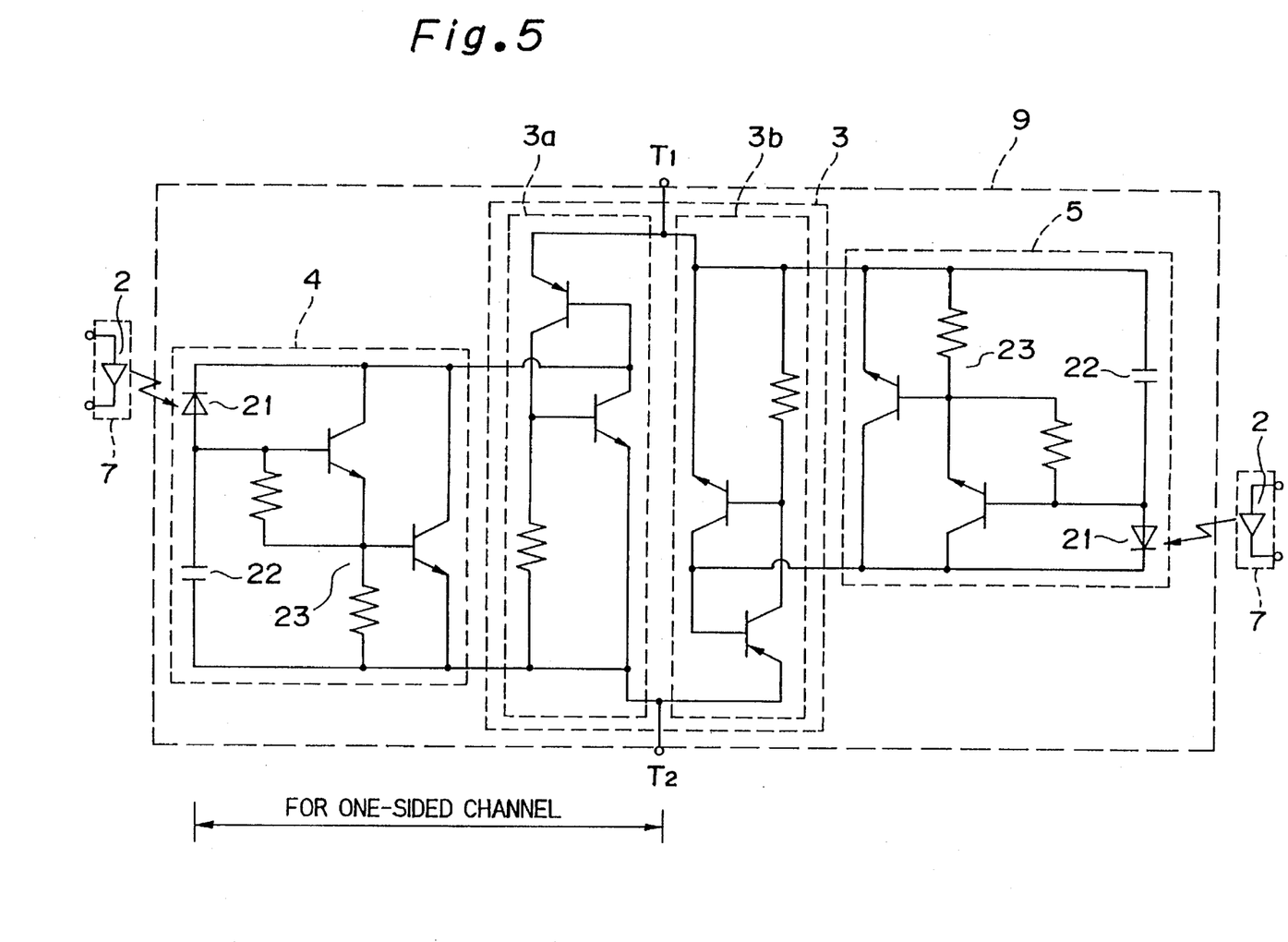
FIG. 5 is a circuit diagram showing a whole circuit for a second chip shown in FIG. 14.
Figure 9:
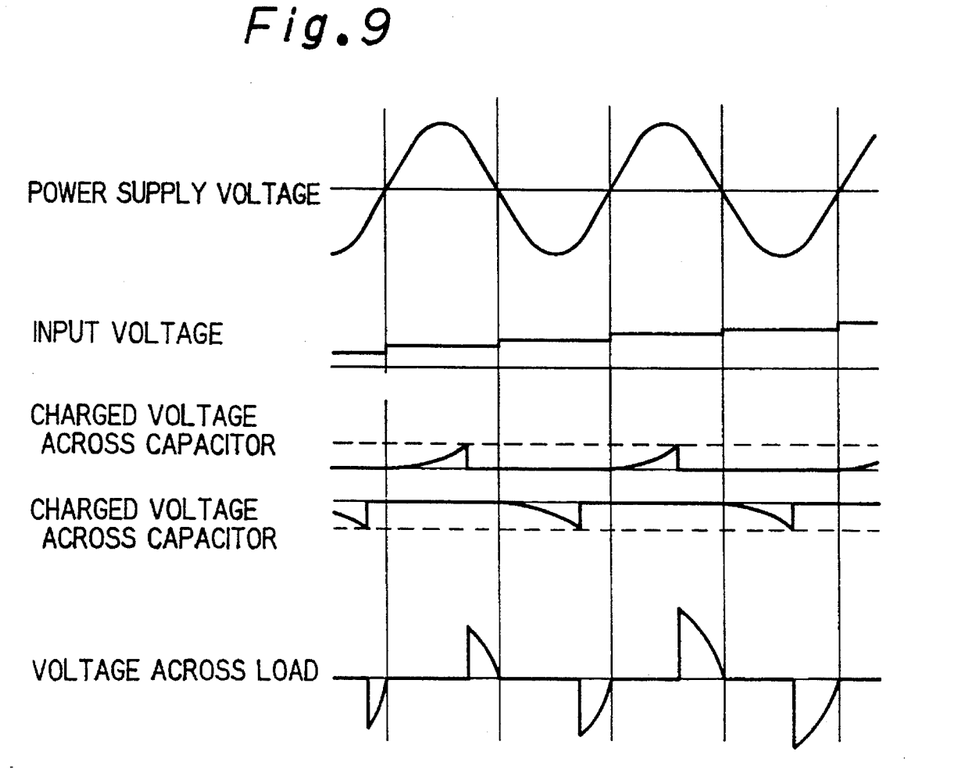
FIG. 9 is a chart showing voltage waveforms at key points in the circuit shown in FIG. 5.

FIG. 5 is a diagram showing a whole circuit configuration of the second chip, and FIG. 9 shows voltage waveforms at key points in the circuit. This circuit will now be discussed.

As stated above, terminals T1 and T2 for the triac 3 and gate-current forming circuits 4 and 5 are connected to the a.c. power supply 51.

Now, when positive half-waves are applied between the terminals T1 and T2, T1 and T2 assume positive and negative, respectively. In the gate-current forming circuit 4, the output current from the light receiving element 21 charges the capacitor 22 to thereby increase the charged voltage $V_C$. When the charged voltage $V_C$ of the capacitor 22 exceeds $V_{BE}$, a current (gate current) flows into the gate Ga of the thyristor portion 3a of the triac, whereby the thyristor portion 3a is activated and electric power is supplied to the load 52. As reverse-biased, the other thyristor portion 3b remains its turn-off state. Once the thyristor portion 3a turns on, it will continue the turn-on state, but it is turned off if the current becomes decreased below a predetermined level.

Next, when negative half-waves are applied between the terminals T1 and T2, T1 and T2 assume negative and positive, respectively. In the gate-current forming circuit 5, the output current from the light receiving element 21 charges the capacitor 22 to thereby increase the charged voltage $V_C$. When the charged voltage $V_C$ of the capacitor 22 exceeds $V_{BE}$, a current (gate current) flows into the gate Gb of the thyristor portion 3b, whereby the thyristor portion 3b is activated. The thyristor portion 3b remains being on so as to supply a voltage across the load 52 before the current becomes decreased below a predetermined level. As reverse-biased, the thyristor portion 3a is in its turn-off state.

Figure 8:
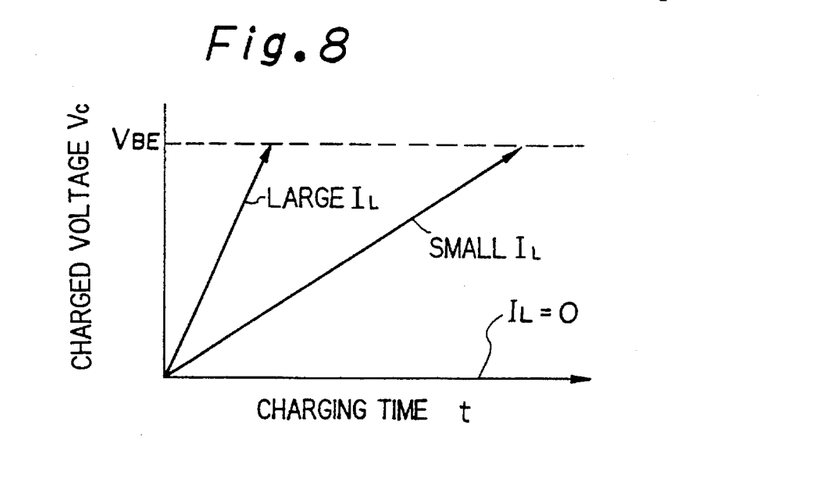
FIG. 8 is a chart showing charging states of a capacitor shown in FIG. 7.

As shown in FIG. 8, the time taken for the charged voltage $V_C$ of the capacitor 22 to reach the turn-on voltage $V_{BE}$ activating the Darlington circuit 23 depends on the magnitude of the current flowing through the light receiving element 21. Specifically, when the magnitudes of the current flowing through the light receiving element 21 is small, it takes a long time for the Darlington circuit 23 to be turned on. In contrast, if the current flowing through the light receiving element 21 is large, the Darlington circuit 23 will be turned on in a short period of time. In one word, regulating the magnitude of the current flowing through the light receiving element 21 makes it possible to control the turn-on timing of the Darlington circuit 23 whereby phase control for the load 52 can be effected. As the current through the light receiving element 21 is associated with the light intensity of the light emitting element 2, when the current flowing through the light emitting element 2 or the input voltage $V_B$ is regulated, it is possible to effect phase control of the applied voltage to the load 52.

Since the gain or amplification factor of the Darlington circuit 23 is quite large, a fine voltage is acceptable as the input voltage, and therefore a junction capacitance formed by a PN-junction in a semiconductor chip is enough useful for the capacity of the capacitor 22. Consequently, it is possible to provide the capacitor 22 inside a semiconductor chip, making the device compact as well as reducing the number of parts.

Figure 10:
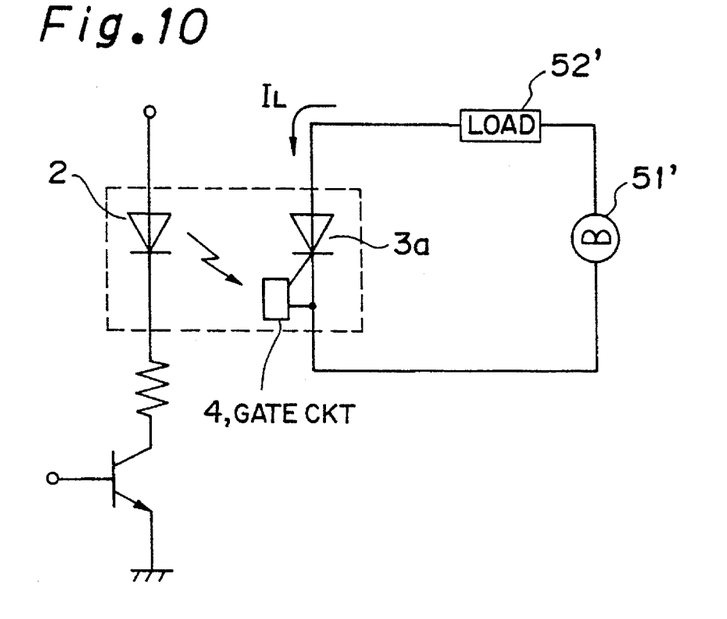
FIG. 10 is a diagram showing a configurational example of a half-wave rectified power source circuit in the circuit shown in FIG. 4.
Figure 11:
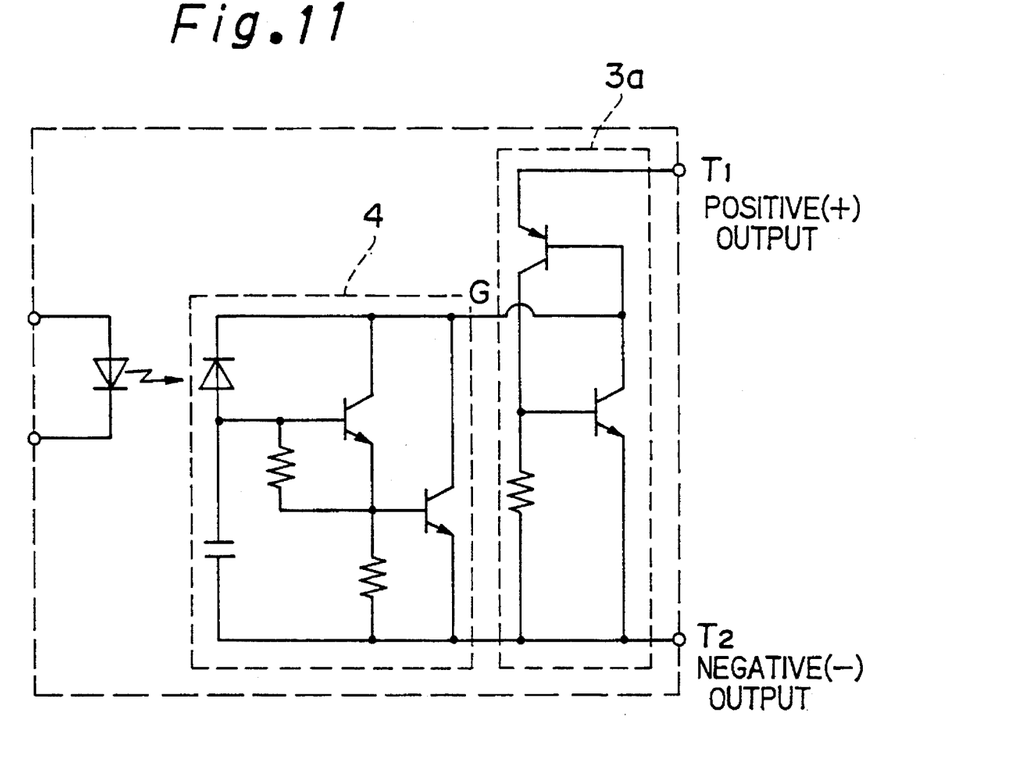
FIG. 11 is a diagram showing a configurational example of a gate-current forming circuit for half-waves in the circuit shown in FIG. 10.

In the case where a half-wave power supply is used, one of the gate-current forming circuits 4 and 5 is used in combination with the corresponding thyristor portion 3a or 3b. For instance, if a positive half-wave power supply 51' is used as a power source, only the gate-current forming circuit 4 for positive half-wave with the corresponding thyristor portion 3a is enough to construct the device, as shown in FIGS. 10 and 11.

Figure 12:
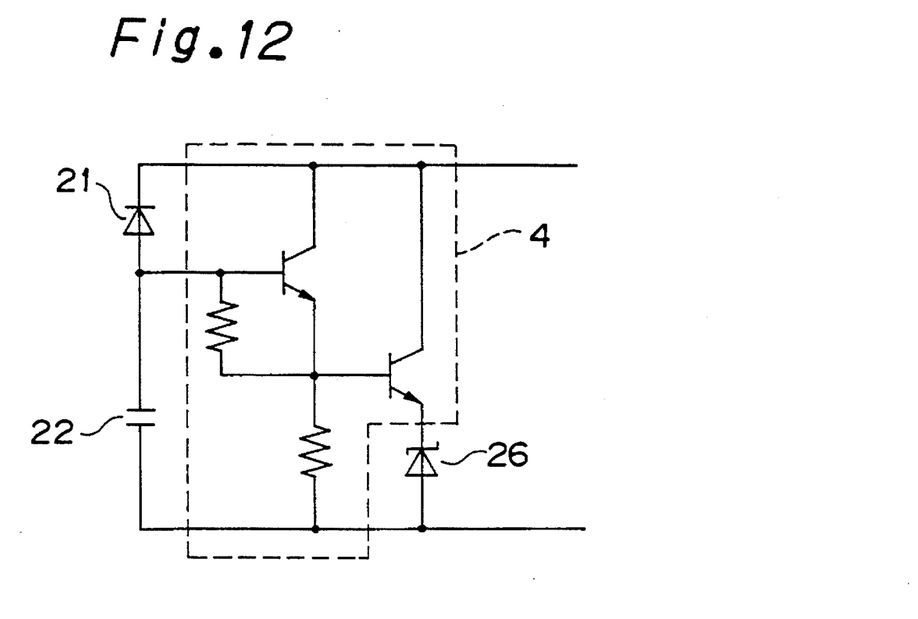
FIG. 12 is a diagram showing a configurational example of a gate-current forming circuit in a device equipped with a photocoupler as a second embodiment of the present invention.
Figure 13:
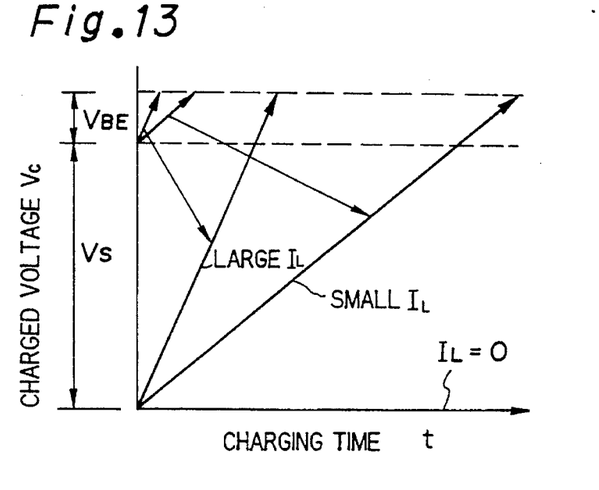
FIG. 13 is a chart showing charging voltages of a capacitor shown in FIG. 12.

As shown in FIG. 12, a trigger element 26 such as a Zener diode, may be interposed in series to the base-emitter circuit of the Darlington circuit 23. Here, only a gate-current forming circuit 4' is shown in the figure. When the trigger element 26 is interposed in this manner, the charged voltage $V_C$ of the capacitor 22 can be raised by a magnitude equivalent to a turn-on voltage $V_S$ of the trigger element 26, whereby it becomes possible to effect phase control in a broadened range with high accuracy, as shown in FIG. 13. Since the time constant of the circuit (the current value at charged state associated with the input light intensity) is the same with that of the configuration shown in FIGS. 4 to 7, it is possible to effect refined control. Also, a diac, SBS (silicon bilateral switch), SSS (silicon symmetrical switch), UJT (uni-junction transistor), PUT (programmable uni-junction transistor) etc., can be used as the trigger element 26 other than the Zener diode.

Although, in the above embodiment, description was made on the triac 3 (thyristor portion 3a and 3b) being built in the photocoupler, if the load 52 as a target of phase control requires a large electric power, a large-power switching element can be used separately from the second chip. More specifically, in such a case, it is possible that only the gate-current forming circuit (for double-sided channels or for one-sided channel) is formed inside the second chip while the switching element such as a large-power triac, thyristor, etc. is externally attached to the gate terminals Ga and Gb of the second chip. By this configuration, it is possible to prevent troubles of the element such as overheating and the like.

Figure 15:
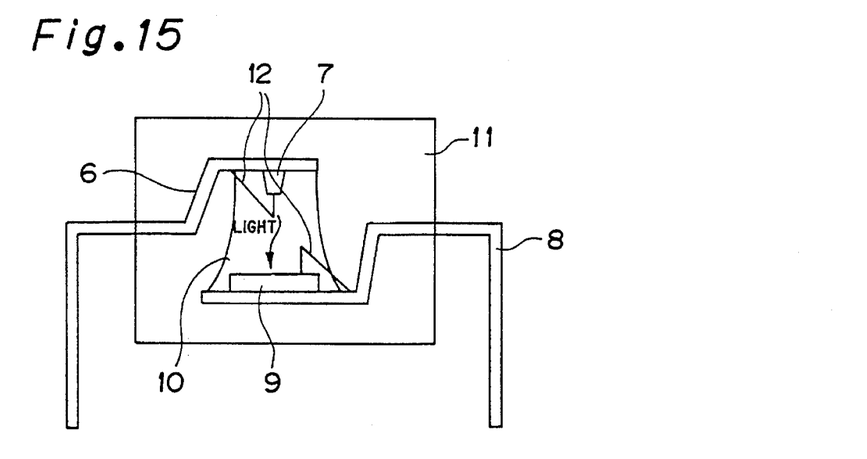
FIG. 15 is an illustration showing another configurational example of a photocoupler used in the present invention.
Figure 16:
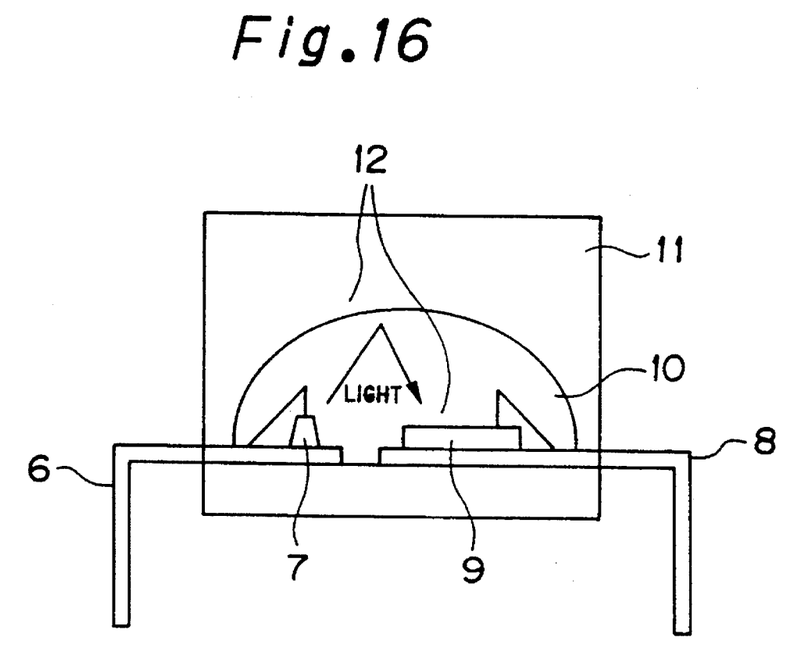
FIG. 16 is an illustration showing a further configurational example of a photocoupler used in the present invention.
Figure 17:
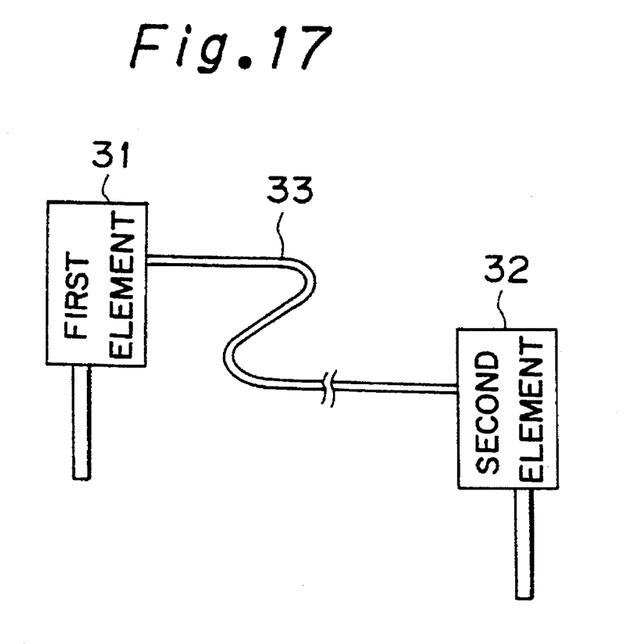
FIG. 17 is an illustration showing still another configurational example of a photocoupler used in the present invention.

Although, the photocoupler in the above description with reference to FIG. 14 was configurated such that first and second chips 7 and 9 may sealed or confined together with lead frames 6 and 8 mounting respective chips 7 and 9, with the light transmissive resin 10, it is also possible to construct the photocoupler by sealing only the chips 7 and 9 or the light-transmitting portion with the light-transmissive resin 10 as shown in FIG. 15. Further, it is also possible to arrange first and second chips 7 and 9 on the same plane as shown in FIG. 16. In this case, the thus arranged chips 7 and 9 are sealed with a light-transmissive resin 10 and over-sealed with a light-shielding resin 11 whereby light emitted from the first chip is reflected on the interface of the light-shielding resin 11 so as to be incident on the second chip. It is also possible to make up a photocoupler, as shown in FIG. 17, using a first element 31 mounting a first chip, a second element 32 mounting a second chip and an optical fiber cable 33 connected between the two elements 31 and 32 to thereby allow light transmission.

As has been apparent from the foregoing detailed description, according to the present invention, the use of the Darlington circuit makes it possible to set up a low charging voltage for a capacitor. This enables the capacitor to be built in a single chip (the second chip) of the photocoupler. Therefore, it becomes possible to obtain phase-controlled signals using only the photocoupler of the invention. Consequently, the photocoupler of the present invention can be made compact, without necessity of arranging a number of separate parts which would be required in the conventional configuration.

According to the present invention, it is possible to effect stabilized control by properly raising the turn-on voltage for the Darlington circuit.

According to the present invention, since a switching element for controlling the power supply to the load is provided in the second chip, the power control of the load can be done by the photocoupler alone.

What is claimed is:

1. A photocoupler capable of effecting phase control, comprising:
   a first chip having a light emitting element emitting light in response to an input current; and
   a semiconductor chip formed with a light receiving element outputting a current having a magnitude related to the intensity of light received from said light emitting element, a junction capacitor formed in said semiconductor chip for storing charges from the output current from said light receiving element, and a Darlington circuit having said capacitor interposed between the base and emitter thereof.

2. The photocoupler of claim 1, further including a sealed structure enclosing said first chip and said semiconductor chip.

3. The photocoupler of claim 1, wherein said junction capacitor comprises a PN junction formed in said semiconductor chip.

4. The photocoupler of claim 1, wherein said capacitor is electrically connected directly to the base and emitter of said Darlington circuit.

5. A photocoupler capable of effecting phase control, comprising:
   a first chip having a light emitting element emitting light in response to an input current;
   a semiconductor chip formed with a light receiving element outputting a current having a magnitude related to the intensity of light received from said light emitting element, a junction capacitor formed in said semiconductor chip for storing charges from the output current from said light receiving element, and a Darlington circuit having said capacitor directly connected to the base thereof; and
   a trigger element connected in series with said capacitor and directly connected to the emitter of said Darlington circuit.

6. The photocoupler circuit of claim 5, wherein said trigger element is one of a Zener diode, a SBS, and a UJT.

7. The photocoupler of claim 5, wherein said trigger element is one of a SSS and a PUT.

8. The photocoupler of claim 5, further including a sealed structure enclosing said first chip and said semiconductor chip.

9. The photocoupler of claim 5, wherein said junction capacitor comprises a PN junction formed in said semiconductor chip.

10. A photocoupler capable of effecting phase control, comprising:
    a first chip having a light emitting element emitting light in response to an input current;
    a second chip formed with a light receiving element outputting a current having a magnitude related to the intensity of light received from said light emitting element, a capacitor formed of a PN-junction for storing charges from the output current from said light receiving element, and a Darlington circuit having said capacitor interposed between the base and emitter thereof; and
    a thyristor, on said second chip, connected to the output gate of said Darlington circuit.

11. The photocoupler of claim 10, further comprising a sealed structure enclosing said first and second chips.

12. A photocoupler capable of effecting phase control, comprising:
    a first chip having a light emitting element emitting light in response to an input current; and
    a second chip formed with a light receiving element outputting a current having a magnitude related to the intensity of light received from said light emitting element, a capacitor formed of a PN-junction for storing charges from the output current from said light receiving element, and a Darlington circuit having said capacitor interposed between the base and emitter thereof;
    a trigger element interposed in series between the base and emitter of said Darlington circuit; and
    a thyristor connected to the output gate of said Darlington circuit.

13. The photocoupler of claim 12, further comprising a sealed structure enclosing said first and second chips.

* * * * *